US006518891B2

(12) United States Patent
Tsutsui et al.

(10) Patent No.: US 6,518,891 B2
(45) **Date of Patent: *Feb. 11, 2003**

(54) ENCODING APPARATUS AND METHOD, RECORDING MEDIUM, AND DECODING APPARATUS AND METHOD

(75) Inventors: Kyota Tsutsui, Kanagawa (JP); Osamu Shimoyoshi, Kanagawa (JP); Hiroyuki Honma, Chiba (JP); Satoshi Miyazaki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/729,605

(22) Filed: Dec. 4, 2000

(65) Prior Publication Data

US 2002/0059063 A1 May 16, 2002

(30) Foreign Application Priority Data

Dec. 10, 1999 (JP) .......................................... P11-352290

(51) Int. Cl.7 ................................................ H03M 7/00
(52) U.S. Cl. ............................ 341/50; 341/51; 704/230
(58) Field of Search .................. 341/50, 51; 369/275.3, 369/47.25; 360/53; 714/758; 386/46

(56) References Cited

U.S. PATENT DOCUMENTS 4,783,654 A * 11/1988 Ichikawa ................... 340/7.28
5,388,105 A * 2/1995 Takagi et al. ............... 714/758
5,528,572 A * 6/1996 Koizumi et al. ......... 369/47.25
5,570,339 A * 10/1996 Nagano ................... 369/275.3
5,734,782 A * 3/1998 Fujiwara et al. .............. 386/46
6,147,826 A * 11/2000 Hashimura ................... 360/53

FOREIGN PATENT DOCUMENTS

EP 0658984 8/1994

OTHER PUBLICATIONS

"Storage of a Data Signal in PASC Frames", Research Disclosures, Kenneth Mason Publications, Hampshire, GB, No. 385, May 1, 1996, p. 308, XP000599735.
Schroeder, E.F., et al., "Der Mpeg–2–Standard: Generische Codierung Fuer Bewegtbilder Und Zugehoerige Audio–Information. Audio–Codierung (Teil 4)", Fernseh Und Kinotechnik, Vde Verlag GMBH. Berlin, DE, vol. 48, No. 7/08, Aug. 30, 1994, pp. 364–368, 370, 37, XP000460964.

* cited by examiner

*Primary Examiner*—Peguy Jeanpierre
*Assistant Examiner*—Jean Bruner Jeanglaude
(74) *Attorney, Agent, or Firm*—Sonnenschein, Nath, Rosenthal

(57) ABSTRACT

The first codec-based dummy string generator 132 generates a first code-cbased dummy string in a first code string conforming to a first format based on the first coding method. The second codec encoder 131 generates a second code string having been encoded with a higher efficiency than the first code string and conforming to a second format different from the first format. The code string generator 133 generates a synthetic code string by embedding the second codec-based code string generated by the second codec encode block 131 in a blank area formed in the first code string based on the first codec-based dummy string generated by the first code dummy string generator 132.

27 Claims, 15 Drawing Sheets

ENCODING APPARATUS AND METHOD, RECORDING MEDIUM, AND DECODING APPARATUS AND METHOD

BACKGROUND OF THE INVENTION

1. Field of the Invention

The present invention relates to an encoding apparatus and method, adapted to encode a second code string conforming to a second format based on a second coding method with a higher efficiency than that of a first code string conforming to a first format based on a first coding method.

2. Description of the Related Art

The technique to record information to a recording medium capable of recording an encoded audio or speech signal, such as a magneto-optical disc or the like, is widely used. For a highly efficient coding of an audio or speech signal, there have been proposed various methods such as the subband coding method (SBC) in which an audio signal or the like on a time base is divided into a plurality of frequency bands without blocking, and the so-called transform coding method in which a signal on the time base is transformed to a signal on the frequency base (spectrum transform), divided into a plurality of frequency bands, and then the signal in each of the frequency bands is encoded. Also, a high efficiency coding method has also been proposed which is a combination of the SBC method and transform coding method. In this third method, for example, after an audio or speech signal is divided into a plurality of frequency bands by the SBC method, the signal in each frequency band is spectrum-transformed to a signal on the frequency base, and the signal is encoded in each spectrum-transformed frequency band. The QMF filter is defined in R.E. Crochiere: "Digital Coding of Speech Subbands", Bell Syst. Tech. Journal, Vol. 55, No. 8, 1976". Also, the method for equal-bandwidth division by filter is defined in Joseph H. Rothweiler: "Polyphase Quadrature Filters—A New Subband Cording Technique", ICASSP 83, BOSTON.

In an example of the above-mentioned spectrum, an input audio signal is blocked at predetermined unit times (frames), and each of the blocks is subjected to the discrete Fourier transform (DFI), discrete cosine transform (DCT) or modified discrete cosine transform (MDCT) to transform a time base to a frequency base. The MDCT is described in "J. P. Princen and A. B. Bradley, Univ. of Surrey Royal Melbourne Inst. of Tech.: Subband/Transform Coding Using Filter Bank Designs Based on Time Domain Aliasing Cancellation, ICASSP, 1987".

When the above-mentioned DFT or DCT is used for transform of a waveform signal to a spectrum, with a time block consisting of M samples will yield a number M of independent real data. Normally, a time block is arranged to overlap M1 samples of its neighboring blocks each to suppress the distortion of the connection between time blocks. Therefore, in the DFT and DCT, a signal will be encoded by quantizing on average M real data for a number (M-M1) of samples.

When the MDCT is used as the method for transform of a waveform signal to a spectrum, M independent real data can be obtained from 2M samples arranged to overlap M ones of its neighboring blocks each. Therefore, in the MDCT, the signal is encoded by quantizing on average M real data for the M samples. In a decoder, waveform elements obtained from a code resulted from the MDCT by inverse transform in each block are added together while being made to interfere with each other, thereby permitting reconstruction of the waveform signal.

Generally, by increasing the length of the time block, the frequency separation of the spectrum is increased and energy is concentrated on a specific spectrum component. Therefore, by transforming a waveform signal to a spectrum with an increased block length obtained by overlapping a time block a half of its neighboring time blocks each and using the MDCT in which the number of spectrum signals obtained will not increase relative to the number of original time samples, it will be possible to enable a coding whose efficiency is higher than that attainable with the DFT or DCT.

By quantizing a signal divided into a plurality of frequency bands by the filtering or spectrum transform as in the above, it is possible to control any frequency band where quantization noise occurs and encode an audio signal with a higher efficiency in the auditory sense, using a property such as the masking effect. Also, by normalizing, for each of the frequency bands, the audio signal with a maximum absolute value of a signal component in the frequency band before effecting the quantization, a further higher efficiency of the coding can be attained.

The width of frequency division for quantization of each frequency component resulted from a frequency band division is selected with the auditory characteristic of the human being for example, taken into consideration. That is, an audio signal is divided into a plurality of frequency bands (25 bands for example) in such a bandwidth as will be larger as its frequency band is higher, which is generally called a "critical band", as the case may be. Also, at this time data in each band is encoded by a bit distribution to each band or with an adaptive bit allocation to each band. For example, when a coefficient data obtained using MDCT is encoded with the above bit allocation, an MDCT coefficient data in each band, obtained using the MDCT at each block, will be encoded with an adaptively allocated number of bits. The adaptive bit allocation information can be determined so as to be previously included in a code string, whereby the sound quality can be improved by improving the coding method even after determining a format for decoding. The known bit allocation techniques include the following two:

One of them is disclosed in "R. Zelinski and P. Noll: Adaptive Transform Coding of Speech Signals", IEEE Transaction of Acoustics, Speech, and Signal Processing, Vol. ASSP-25, No. 4, August 1977. This technique is such that the bit allocation is made based on the size of a signal in each frequency band. With this technique, the quantization noise spectrum can be flat and the noise energy be at a minimum, but since no masking effect is used, the actual noise will not feel auditorily optimum.

The other one is disclosed in "M. A. Kransner, MIT: The Critical Band Coder—Digital encoding of the perceptual requirements of the auditory system, ICASSP, 1980". This technique is such that the auditory masking is used to acquire a necessary signal-to-noise ratio for each frequency band, thus making a fixed bit allocation. With this technique, however, since the bit allocation is a fixed one , the signal characteristic will not be so good even when it is measured on a sine wave input.

To solve the above problem, there has been proposed a high efficiency encoder in which all bits usable for the bit allocation are divided for a fixed bit allocation pattern predetermined for each small block and for a bit distribution dependent upon a signal size of each block at a ratio dependent upon a signal related with an input signal and whose number of bits for the fixed bit allocation pattern is larger as the spectrum of the signal is smoother.

With the above method adopted in the encoder, the entire signal-to-noise ratio can considerably be improved by allocating more bits to a block including a specific spectrum to which energy is concentrated, such as a sine wave input. Generally, since the human ears are extremely sensitive to a signal having a steep spectrum component, the above method can be used to improve the signal-to-noise ratio, which does not only improve a measured value but also can effectively improve the sound quality.

The bit allocation methods include many other ones as well. The auditory model is further elaborated to enable a higher-efficiency coding if the encoder could. Generally, in these methods, a reference for the real bit allocation to realize a computed signal-to-noise ratio with a highest possible fidelity is determined and an integral value approximate to the computed value is taken as a number of allocated bits.

For example, the present invention has proposed an encoding method in which a signal component having an auditorily important tone component, namely, a signal component having an energy concentrated around a predetermined frequency thereof, is separated from a spectrum signal and encoded separately from the other spectrum component. Thus, this method allows encoding of an audio signal or the like, efficiently, with a high compression rate with little auditory deterioration.

To form an actual code string, it suffices to first encode quantizing precision information and normalizing coefficient information with a predetermined number of bits for each frequency band in which the normalization and quantization are effected, and then encode the normalized and quantized signals. Also, in the ISO/IEC 11172-3: 1998 (E), 1993, a high efficiency coding method is defined in which the number of bits indicating quantizing precision information varies from one frequency band to another in such a manner that as the frequency is higher, the number of bits indicating quantizing precision information will be smaller.

It has also been proposed to determine quantizing precision information based on normalizing coefficient information for example, in a decoder instead of directly encoding the quantizing precision information. In this method, however, since the relation between the normalized efficient information and quantizing precision information will be determined when a format is set, it is not possible to introduce the control of the precision of quantization based on a further advanced auditory model which will be available in the future, if at all. Also, when a compression rate to be realized ranges widely, it is necessary to determine the relation between the normalizing coefficient information and quantizing precision information for each compression rate.

Also, there is known an encoding method in which a quantized spectrum signal is encoded using a variable-length code defined in "D. A. Huffman: A Method for Construction of Minimum Redundancy Codes, Proc. I. R. E, 40, p. 1098 (1952)" for example with a higher efficiency.

As in the above, techniques for a higher-efficiency coding have been developed one after another. By employing a format incorporating a newly developed technique, it is possible to record for a longer time, and also record an audio signal having a higher sound quality for the same length of recording time.

However, if players capable of playing back only signals recorded in a predetermined format (will be referred to as "first format" hereinafter) prevail (this player will be referred to as "first format-conforming player" hereinafter), the first format-conforming players will not be able to read a recording medium in which signals are recorded in a format using a higher-efficiency coding method (this format will be referred to as "second format" hereinafter). More specifically, even if the recording medium has a flag indicating a format when the first format is determined, the first format-conforming player adapted to read a signal with no disregard for the flag signal will read signals from the recording medium taking that all signals in the recording medium have been recorded in the first format. Therefore, all the first format-conforming players will not recognize that signals in the recording medium have been recorded in the second format if applicable. Thus, if the first format-conforming player plays back a signal recorded in the second format in the recording medium taking that the signal has been recorded in the first format, a terrible noise will possibly occur.

SUMMARY OF THE INVENTION

It is therefore an object of the present invention to overcome the above-mentioned drawbacks of the prior art by providing an encoding apparatus and method, in which a second code string conforming to a second format and which has been encoded with a higher efficiency than a first code string conforming to a first format, is played back silently by a player intended for playing back the first code string conforming to the first format.

The above object can be attained by providing an encoder including according to the present invention:

- means for generating a dummy string;
- a first encoding means for generating a first code string by forming a blank area in a frame based on the dummy string;
- a second encoding means for generating a second code string by encoding an input signal; and
- a code string synthesizing means for generating a synthetic code string by embedding the second code string generated by the second encoding means in the blank area in the first code string.

Also the above object can be attained by providing an encoding method including according to the present invention:

- a step of generating a dummy string;
- a first encoding step of generating a first code string by forming a blank area in a frame based on the dummy string;
- a second encoding step of generating a second code string by encoding an input signal; and
- a code string synthesizing step of generating a synthetic code string by embedding the second code string generated by the second encoding means in the blank area in the first code string.

Also the above object can be attained by providing an encoder including according to the present invention:

- a first encoding means for generating a first code string;
- a second encoding means for generating a second code string; and
- a code string synthesizing means for generating a synthetic code string in such a manner that a part of the second code string generated by the second encoding means forms a part of the first code string.

Also the above object can be attained by providing an encoding method including according to the present invention:

- a first encoding step of generating a first code string;
- a second encoding step of generating a second code string; and
- a code string synthesizing step of generating a synthetic code string in such a manner that a part of the second code string generated by the second encoding means forms a part of the first code string.

Also the above object can be attained by providing a recording medium having, according to the present invention, a synthetic code string obtained by embedding a second code string recorded in a blank area formed in a first code string based on a dummy string formed in the first code string.

Also the above object can be attained by providing a recording medium having recorded therein, according to the present invention, a code string synthesized so that a part of a second code string forms a part of a first code string.

Also the above object can be attained by providing a decoder including according to the present invention:

- means for receiving a synthetic code string obtained by embedding a second code string in a blank area formed in a first code string based on a dummy string generated in the first code string;
- means for detecting the dummy string from the synthetic code string received by the synthetic code string receiving means;
- means for decoding the second code string; and
- means for controlling output of a signal generated by decoding the second code string according to whether the dummy string detecting means has detected a predetermined dummy string.

Also the above object can be attained by providing a decoding method including, according to the present invention, steps of:

- receiving a synthetic code string obtained by embedding a second code string in a blank area formed in a first code string based on a dummy string generated in the first code string;
- detecting the dummy string from the synthetic code string received at the synthetic code string receiving step;
- decoding the second code string; and
- controlling output of a signal generated by decoding the second code string depending upon whether the dummy string detecting means has detected a predetermined dummy string.

Also the above object can be attained by providing a decoder including according to the present invention:

- means for receiving a code string synthesized so that a part of a second code string forms a part of a first code string;
- means for detecting a predetermined dummy string from the synthetic code string received by the synthetic code string receiving means;
- means for decoding the second code string; and
- means for controlling output of a signal generated by decoding the second code string depending upon whether the dummy string detecting means has detected the predetermined string.

Also the above object can be attained by providing a decoding method including, according to the present invention, steps of:

- receiving a code string synthesized so that a part of a second code string forms a part of a first code string;
- detecting a predetermined dummy string from the synthetic code string received at the synthetic code string receiving step;
- decoding the second code string; and
- controlling output of a signal generated by decoding the second code string depending upon whether the dummy string detecting means has detected the predetermined string.

These objects and other objects, features and advantages of the present intention will become more apparent from the following detailed description of the preferred embodiments of the present invention when taken in conjunction with the accompanying drawings.

DETAILED DESCRIPTION OF THE PREFERRED EMBODIMENTS

Figure 1:
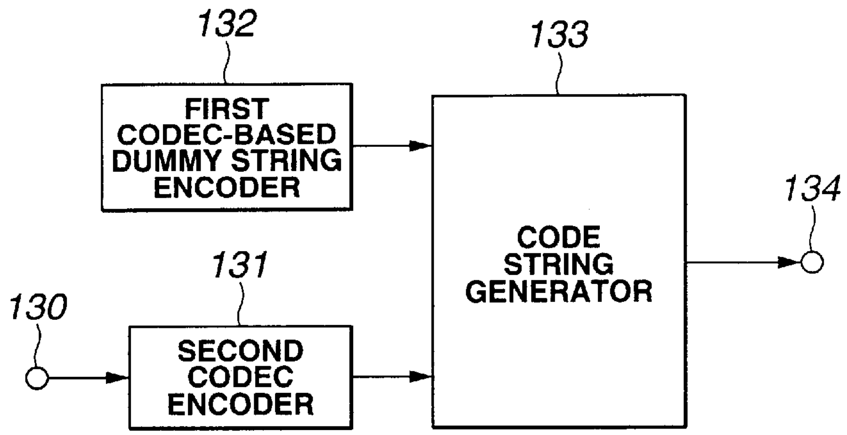
FIG. 1 is a block diagram of a preferred embodiment of the encoder according to the present invention.

Referring first to FIG. 1, there is illustrated in the form of block diagram the preferred embodiment of the encoder according to the present invention. To enable a silent playback without generation of a noise even when a first format-conforming player reads a recording medium having recorded therein a second code string conforming to a second format based on a second coding method which will further be described and having been encoded with a higher efficiency than a first code string conforming to a first format based on a first coding method which will further be described later, the encoder shown in FIG. 1 embeds the second code string conforming to the second format in the first code string conforming to the first code string. Note that the first format is an existing old format while the second format is a new format upper-compatible with the first format.

Therefore, the encoder includes a first codec-based dummy string generator 132 to generate a first codec-based dummy string in the first code string conforming to the first format based on the first coding method, a second codec encode block 131 to generate a second code string having been encoded with a higher efficiency than the first code string and conforming to the second format different from the first format, and a code string generator 133 to generate a synthetic code string by embedding the second codec-based code string generated by the second codec encode block 131 in a blank area in the first code string based on the first codec-based dummy string generated by the first codec-based dummy string generator 132.

Note that the "codec" generally means "code-decode" but it will be used herein in each of the encoding and decoding methods to mean intra-codec encoding and intra-codec decoding, respectively.

The first codec-based dummy string generator 132 will be described in detail later. It generates, as a dummy string, a first format header of a frame (encoded frame) being a unit for encoding in the first format based on the first coding method, and zero bit-allocated quantizing precision data.

The first coding method is a kind of high-efficiency coding for compression. In the first coding method, an input signal such as audio PCM signal or the like is encoded with a high efficiency using the subband coding (SBC), adaptive transform coding (ATC) and adaptive bit allocation.

Figure 2:
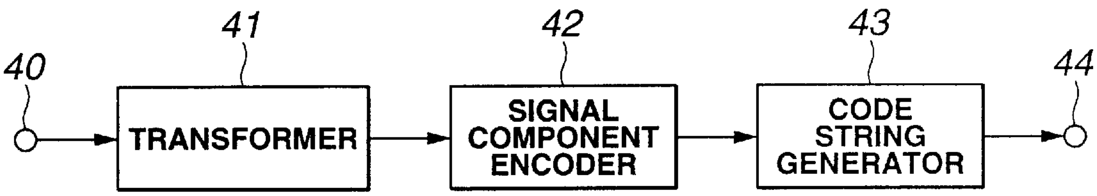
FIG. 2 is a block diagram of a first conventional encoder to encode an input signal based on a first coding method.

Referring now to FIG. 2, there is illustrated in the form of a block diagram a first conventional encoder to encode an input signal based on the first coding method. The signal supplied at an input terminal 40 is transformed by a transformer 41 to signal frequency components, and each of the components is encoded by a signal component encode block 42. A code string generator 43 generates a code string which will be delivered at an output terminal 44.

Figure 3:
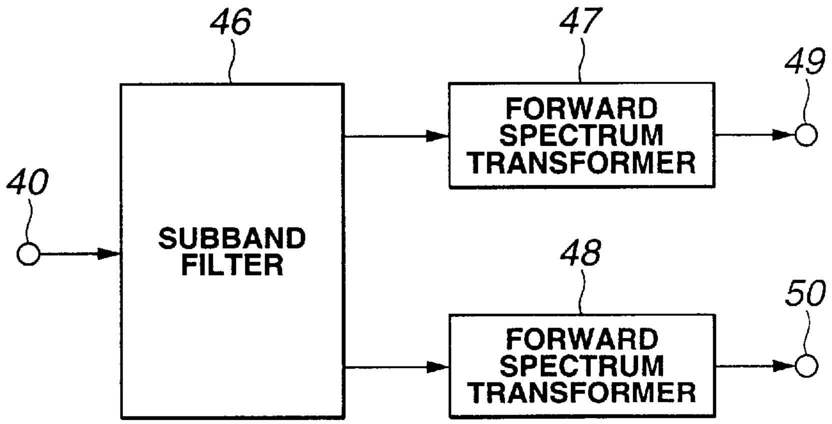
FIG. 3 is a block diagram of a transform block forming the first conventional encoder.

Referring now to FIG. 3, there is illustrated in the form of a block diagram the transformer 41 forming the first conventional encoder. As shown, in the transformer 41 in the first conventional encoder, a signal divided by a subband filter 46 into two frequency bands is transformed by forward spectrum transformers 47 and 48 such as MDCT to spectrum signal components in the respective frequency bands. The bandwidth of the spectrum signal components from the forward spectrum transformers 47 and 48 is a half of the bandwidth of the input signal, namely, it is halved. Of course, the transformer 41 may be any other one selected from many transformers. For example, the input signal may be transformed by the MDCT directly to spectrum signal components. Otherwise, it may be transformed by the DFT or DCT in place of the MDCT to spectrum signal components. Also it is possible to divide the input signal by the so-called subband filter into frequency band components. In this embodiment, however, it will be convenient to transform an input signal to frequency components by the spectrum transform by which it is made possible to obtain many frequency components with a relatively small number of operations.

Figure 4:
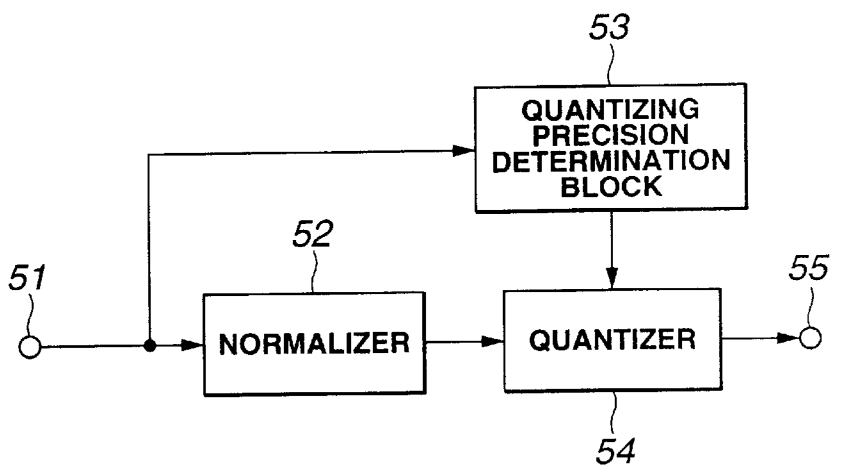
FIG. 4 is a block diagram of a signal component encode block forming the first conventional encoder.

Referring now to FIG. 4, there is illustrated in the form of a block diagram the signal component encode block 42 in FIG. 2. As shown, each signal component supplied from an input terminal 51 is normalized by a normalizer 52 for each predetermined frequency band, and then quantized by a quantizer 54 based on a quantizing precision data calculated by a quantizing precision determination block 53. The quantizer 54 provides quantized signal components and normalizing coefficient information and quantizing precision information. These outputs are delivered at an output terminal 55.

Figure 5:
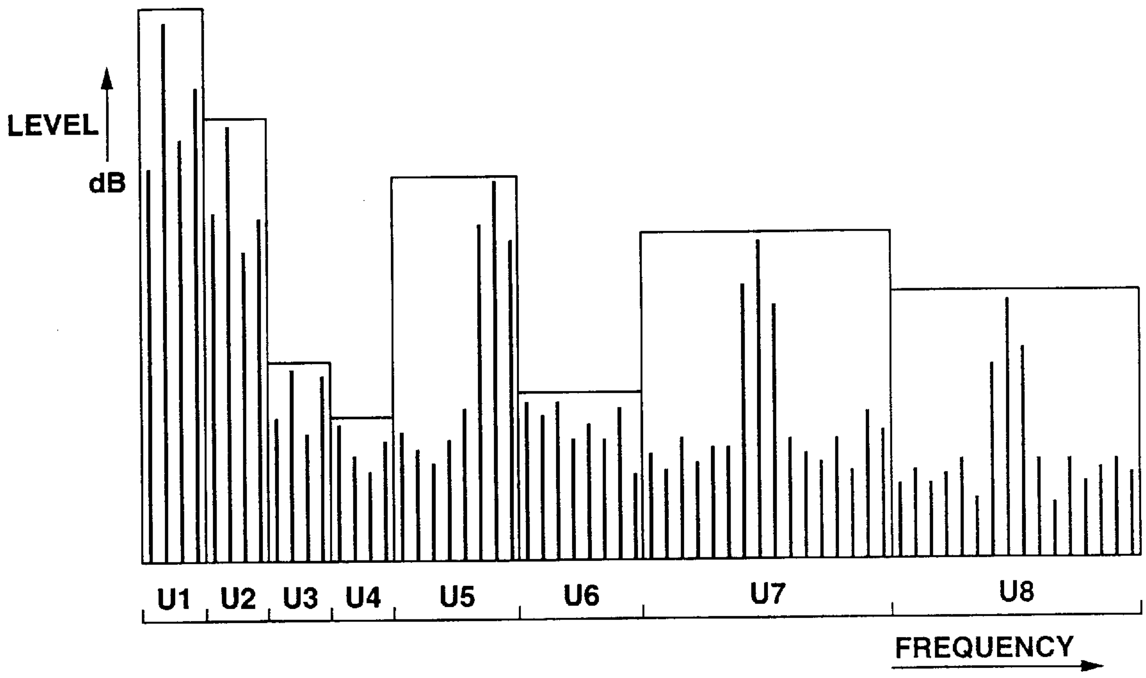
FIG. 5 explains a first coding method which is adopted in the first conventional encoder shown in FIG. 2.

Referring now to FIG. 5, there is illustrated a first conventional coding method adopted in the first conventional encoder shown in FIG. 2. The spectrum signal has been provided from the transformer 41 shown in FIG. 3. In FIG. 5, the absolute value of the spectrum signal from the MDCT is transformed to a level (dB). The input signal is transformed to 64 spectrum signals each for a predetermined time block (frame). The spectrum signals are grouped in 8 bands from U1 to U8 (each will be referred to as "encoding unit" hereinafter), and they are normalized and quantized for each encoding unit. By varying the quantizing precision for each encoding unit depending upon how the frequency components are distributed, the deterioration of sound quality can be minimized for an auditorily high efficiency of encoding. If any spectrum signal in the encoding unit has not to be encoded actually, the encoding unit may be allocated zero bit to make silent the signal in the frequency band corresponding to the encoding unit.

Figure 6:
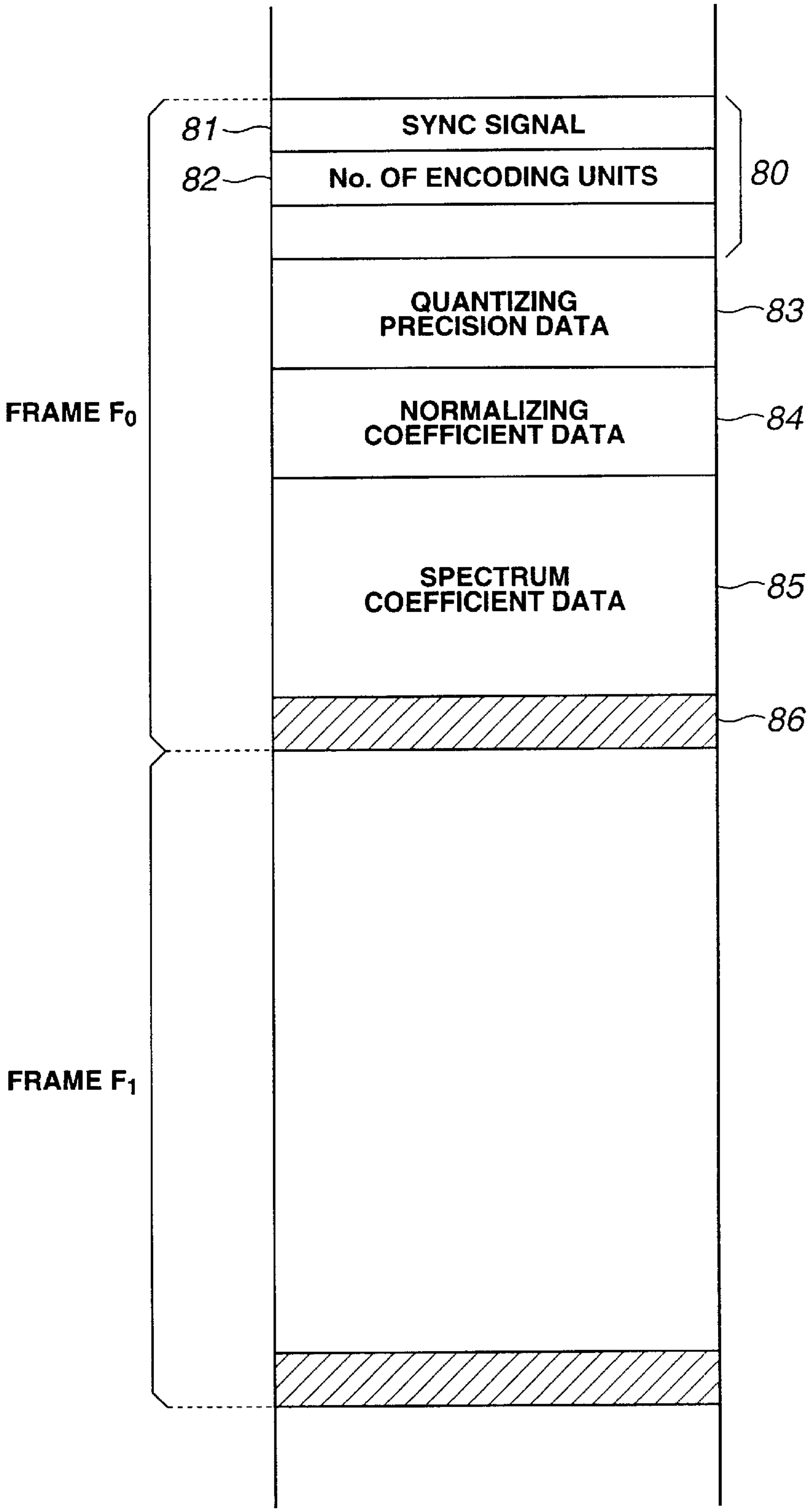
FIG. 6 shows in detail a code string which will be when a signal encoded by the first encoder is recorded into a recording medium.

Referring now to FIG. 6, there is illustrated in detail a code string which will be when a signal encoded by the first encode block is recorded into a recording medium. In this example, each of the encoding frames $F_0$, $F_1$, . . . has disposed at the top thereon a fixed-length header 80 in which a sync signal 81 and a number of encoding units 82 are recorded. In the code string, the header 80 is followed by quantizing precision data 83 for the number of encoding units 82, and the quantizing precision data 83 is followed by normalizing coefficient data 84 for the number of encoding units 82. Normalized and quantized spectrum coefficient data 85 follows the normalizing coefficient data 84. In case each of the encoding frames $F_0$, $F_1$, has a fixed length, a blank area 86 may be provided following the spectrum coefficient data 85.

Figure 7:
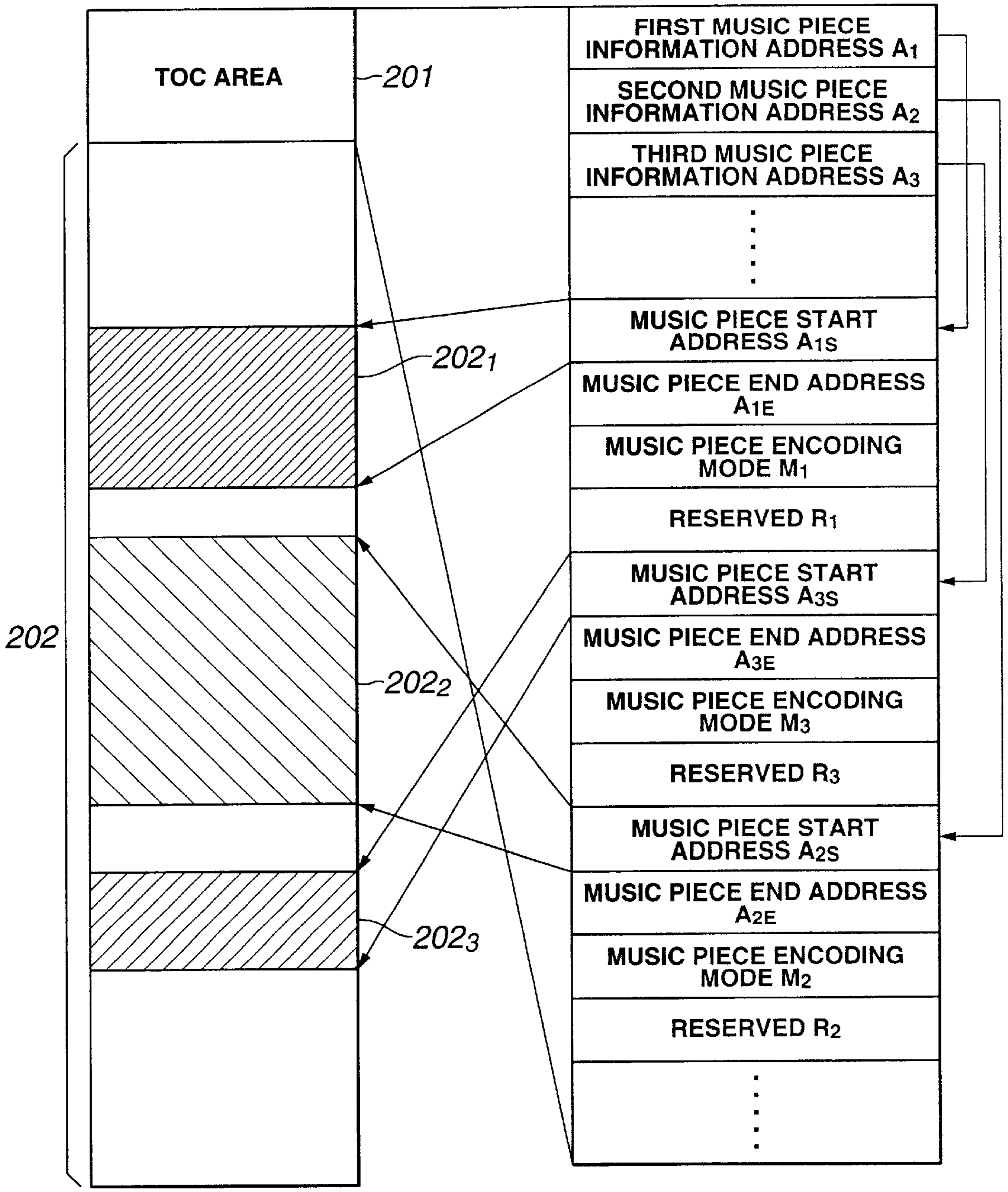
FIG. 7 explains a code string of a music piece formed from a sequence of frames generated by the first conventional encoder, and TOC area.

Referring now to FIG. 7, there is illustrated a code string of a music piece formed from a sequence of encoding frames $F_0$, $F_1$, . . . generated by the first conventional encoder, and a TOC area 201. The code string and TOC area 201 are recorded in a recording medium. As shown in FIG. 7, a signal recording area 202 includes areas 202, 2022 and 2032. Each of the areas 202, to 2023 has recorded therein a code string of a music piece formed from the sequence of encoding frames $F_0$, $F_1$, . . . The TOC area 201 has recorded therein information on which portion each music piece starts at or similar information, which makes it possible to know where the leading end and trailing end of each music piece exist. More specifically, the TOC area 201 has recorded therein a first music piece information address A1, second music piece information address A2, third music piece information address A3, . . . The first music piece information address A1 includes a first music piece start address A1S, music piece end address A1E, music piece encoding mode M1 and reserved information R1 recorded in the area $202_1$. Similarly, the second music piece information address A2 includes a second music piece start address A2S, music piece end address A2E, music piece encoding mode M2 and reserved information R2 recorded in the area $202_2$. Note that the music piece encoding mode is for example the compress coding mode such as ATC.

The first coding method having been described in the foregoing can further be improved in efficiency of coding. For example, a relatively small code length is assigned to ones of the quantized spectrum signals that appear frequently while a relative large code length is assigned to ones of the quantized spectrum signals that appear less frequently, thereby permitting to improve the efficiency of coding. Also, when the transform block length is increased, sub information such as quantizing precision information and normalizing coefficient information can relatively be reduced in amount and the frequency resolution can be raised, so that the quantizing precision on the frequency base can be controlled more elaborately. The efficiency of coding can thus be improved.

Moreover, the present invention includes a method in which a signal component having a special auditory importance, that is, a signal component having energy concentrated around a predetermined frequency thereof, is separated from a spectrum signal and it is encoded separately from other spectrum components. This method permits encoding of an audio signal efficiently at a high compression rate with little auditory deterioration. It should be noted that this embodiment adopts this encoding method as the second coding method.

The second codec encode block 131 shown in FIG. 1 is supplied with an input via an input terminal 130 and generates, using the second coding method, a second codec-based code string 120 which will be embedded in a blank area shown in FIG. 12 and which will further be described later. However, the second codec encode block 131 has the functions of both the transformer 41 and signal component encode block 42 shown in FIG. 2.

Figure 8:
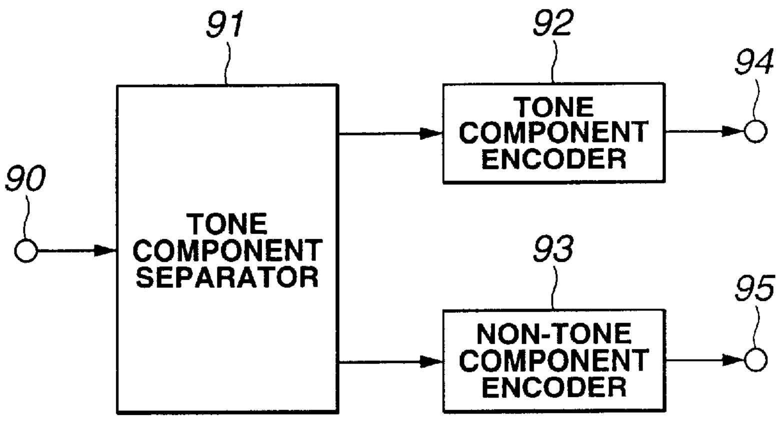
FIG. 8 is a block diagram of a signal component encode block forming together with the transform block the second codec encode block shown in FIG. 1.

The signal component encode block 42 forming along with the transformer 41 the second codec encode block 131 in FIG. 1 is constructed as shown in FIG. 8. As shown, the output of the transformer 41 shown in FIG. 2 is supplied to a tone component separator 91 via an input terminal 90. The tone component separator 91 separates the transformed output of the transformer 41 into a tone component and non-tone component and supplies them to a tone component encode block 92 and non-tone component encode block 93, respectively. The tone component encode block 92 and non-tone component encode block 93 are constructed similarly to the encode block shown in FIG. 4 and encode the tone component and non-tone component, respectively. The tone component encode block 92 encodes position data of the tone component as well.

Figure 9:
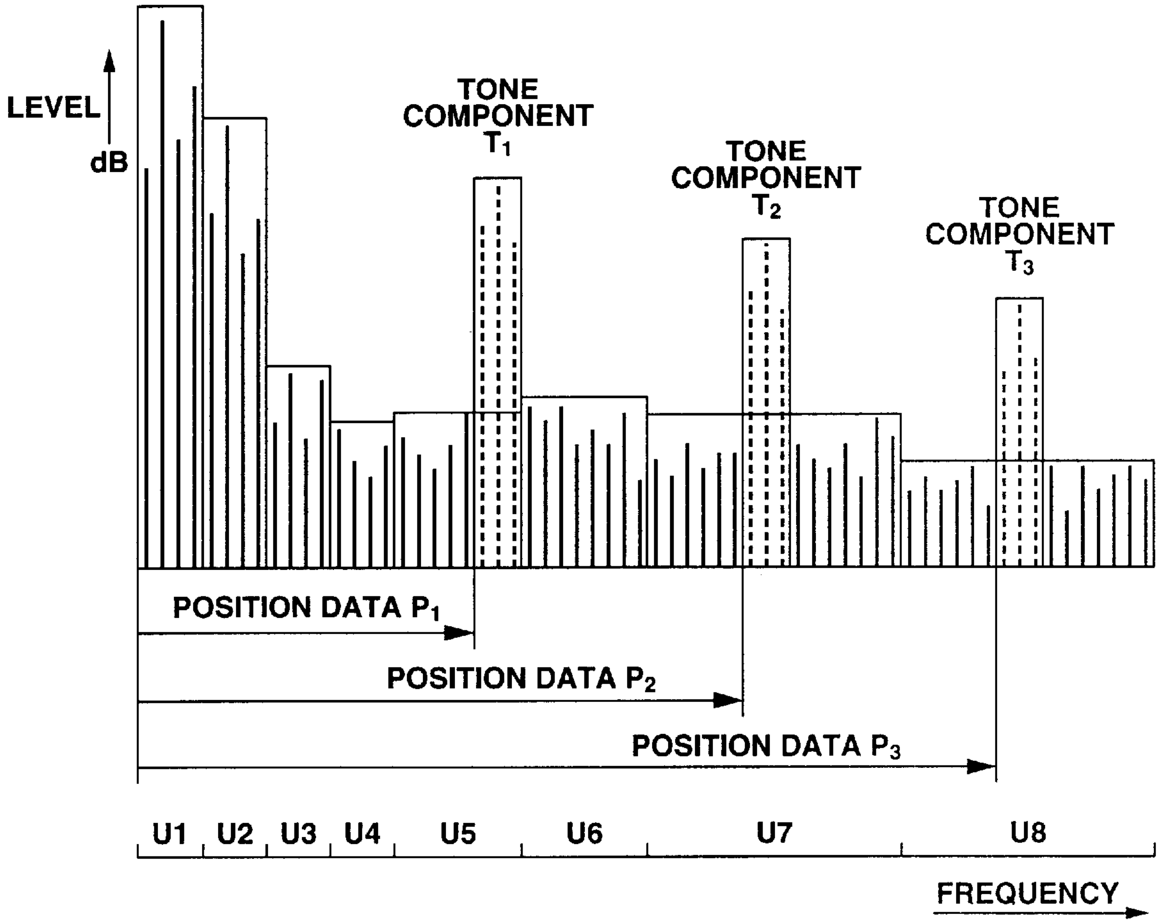
FIG. 9 explains a spectrum the signal component encode block shown in FIG. 8 is to encode.

The spectrum to be encoded by the signal component encode block 42 will be described below with reference to FIG. 9. Also in FIG. 9, the absolute spectrum value of the MDCT is transformed to a level (dB). An input signal is transformed to sixty four spectrum signals for each predetermined time block (encoding frame). The 64 spectrum signals are grouped into eight encoding units from U1 to U8, and normalized and quantized for each encoding unit. Note that although the description is made herein concerning the 64 spectrum signals for the simplicity of the illustration and explanation, 128 pieces of spectrum data can be provided if the transform length is set double that in the example shown in FIG. 5. The difference from that in FIG. 5 is that a high-level one is separated as a tone component Ti from the spectrum signals and encoded. For example, for three tone components T1, T2 and T3, their respective position data P1, P2 and P3 are also required. However, spectrum signals from which the tone components T1, T2 and T3 have been extracted can be quantized with less bits. This method can conveniently be adopted for a signal including a special spectrum signal to which energy is concentrated, thereby permitting to attain a high efficiency of encoding.

Figure 10:
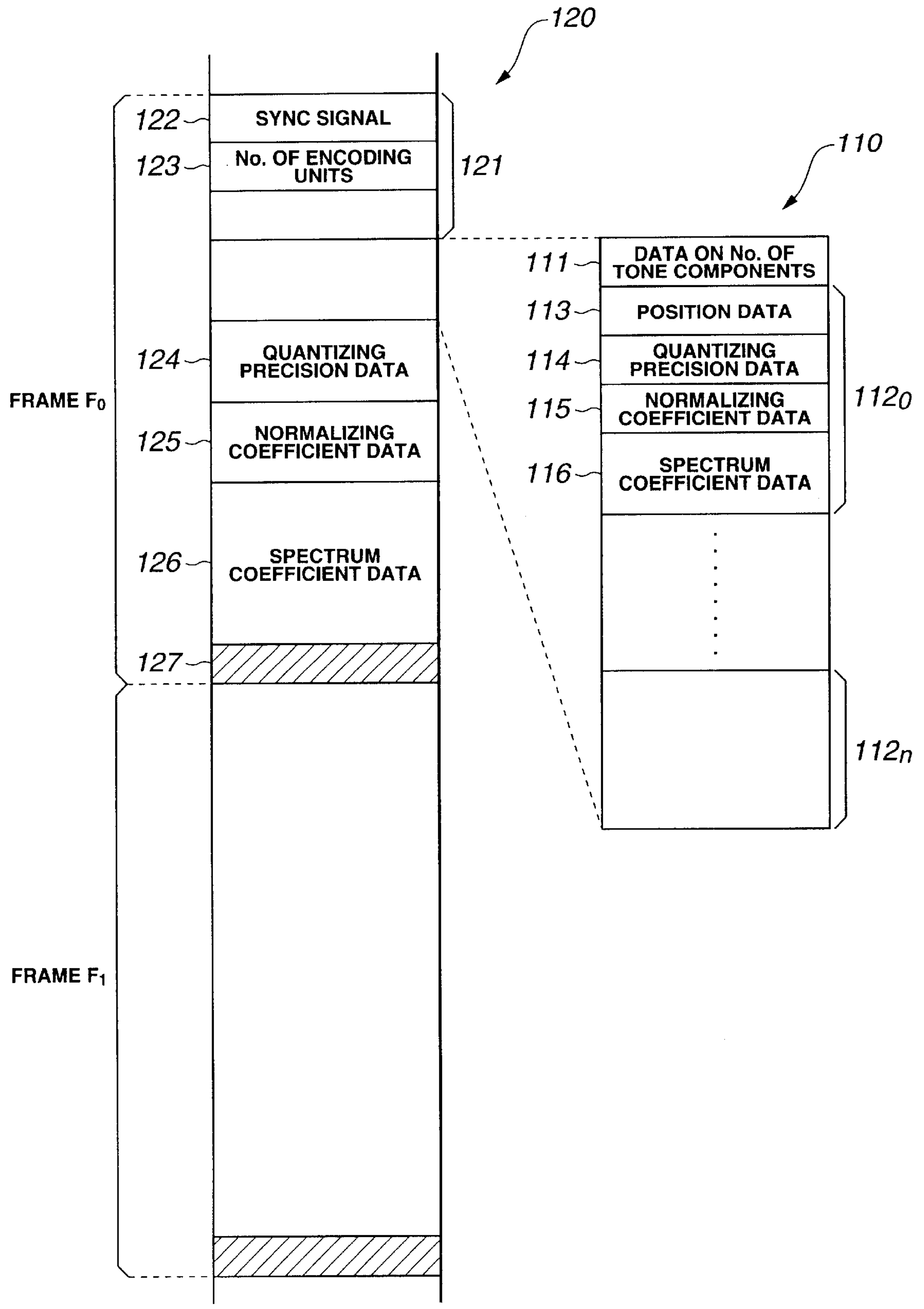
FIG. 10 shows in detail a code string which will be when a signal encoded by the second coding method is recorded into the recording medium.

Referring now to FIG. 10, there is illustrated in detail a specific example of a code string which will be when a signal encoded by the second coding method is recorded into a recording medium. In this example, a tone code string 110 is recorded between a header 121 and quantizing precision data 124 in a code string 120 generated by the second coding method to separate tone components from each other. The code string 120 generated by the second coding method is a one having recorded therein a second header 121 including a sync signal 122, number of encoding units 123, etc., the second header 121 being followed by the tone code string 110, quantizing precision data 124, normalizing coefficient data 125, spectrum coefficient data 126, etc. in this order. The tone code string 110 has first recorded therein a number of tone components 111, the latter being followed by data on each tone component $112_0$, more specifically, position data 113, quantizing precision data 114, normalizing coefficient data 115 and spectrum coefficient data 116. Further in this example, the length of transform block to be transformed to spectrum signals is set double that in the example based on the first coding method shown in FIG. 6 to raise the frequency resolution, and in addition, a variable-length code is introduced to record, in the encoding frames $F_0$, $F_1$, . . . , of the same number of bytes as that in the example in FIG. 6, a code string of an acoustic signal having a length two times larger than that in the example in FIG. 6.

The embodiment of the encoder according to the present invention shown in FIG. 1 is intended to prevent a terrible noise from occurring when a recording medium having information recorded in the code string shown in FIG. 10 is played in a player capable of reading only a recording medium having information recorded in the code string shown in FIG. 6.

Figure 11:
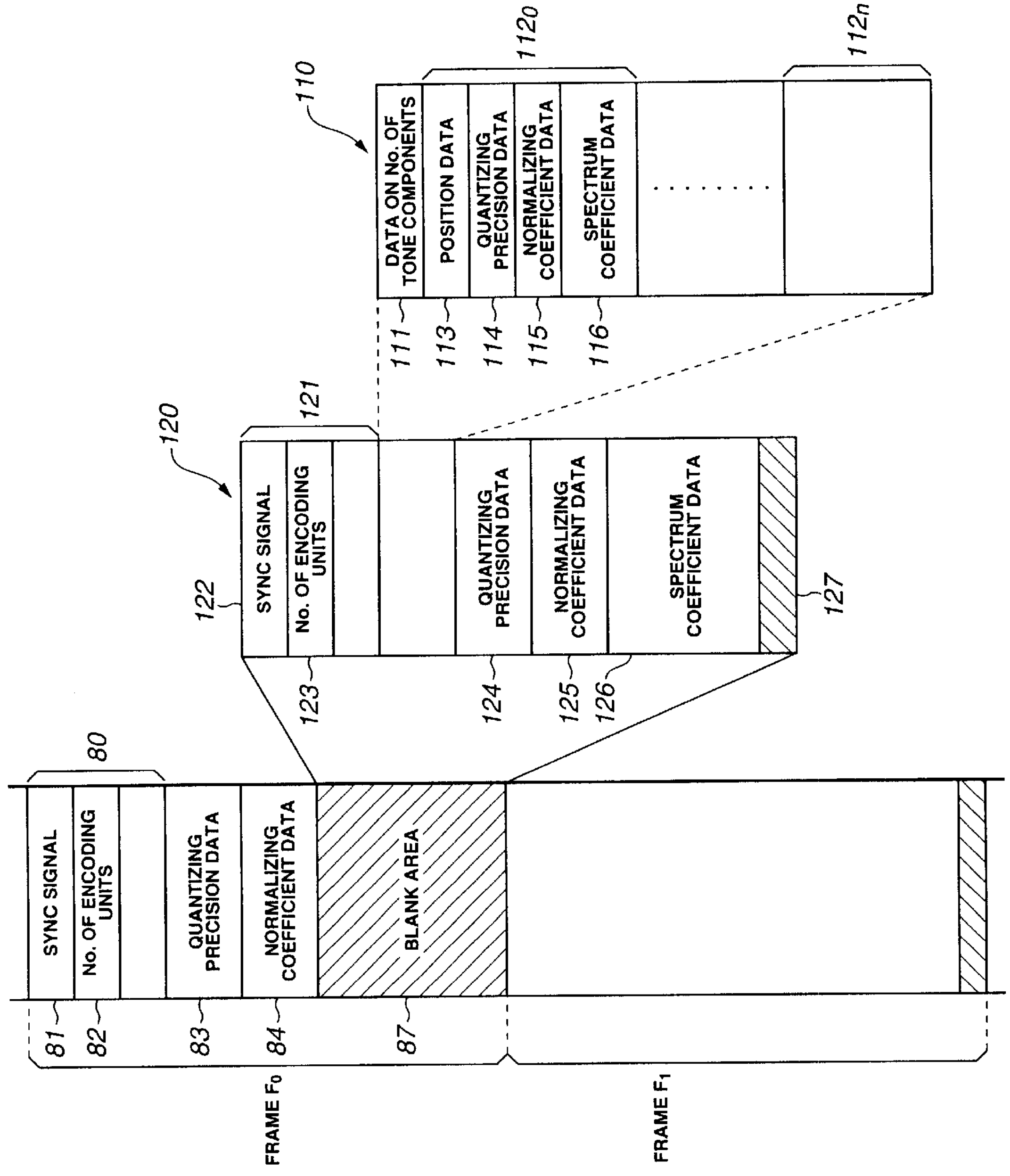
FIG. 11 explains a first method adopted in the encoder shown in FIG. 1.

To avoid the above, the encoder shown in FIG. 1 uses the first coding method to record, as shown in FIG. 11, a silent signal in the first format, and the second coding method to record the second code string having been encoded with a high efficiency and conforming to the second format in a blank area formed with the silent signal has been recorded, thereby implementing a long recording time. More specifically, the first format header (fixed-length header) 80 and zero bit-allocated quantizing precision data 83 are generated as a first codec-based dummy string by a first codec-based dummy string generator 132, and a silent area is formed based on the first codec-based dummy string. Namely, when the quantizing precision data 83 is allocated zero, no bit may be allocated to the spectrum coefficient data 85 in FIG. 6. Thus, the normalizing coefficient data 84 shown in FIG. 11 is followed by the blank area 87. A second code string conforming to the second format, generated by the second coding method, is embedded in the blank area 87. Thus, a relatively wide recording area can be assured for the second coding method, and even if the second code string is played back by the first format-conforming player, no noise will occur. With the number of encoding units being set to a minimum one allowable by the first format, a wide recording area can be assured for the second codec and the top position of the second codec can be fixed.

Further, the encoder shown in FIG. 1 adopts a second method by which a further wide recording area can be assured for the second coding method while preventing noise from occurring when the second code string is played in the first formed-conforming player, thereby permitting to implement a higher sound quality. This second method is shown in FIG. 12. As shown, the quantizing precision data 83 of all the encoding units, defined by the number of encoding units 82 written in the first format header 80, is set zero while the code string 120 generated by the second coding method is recorded in a blank area 88 immediately after the quantizing precision data 83. More specifically, 4 bytes is allocated to the first format header 80, a total of 10 bytes (80 bits) for 20 encoding units, in which one quantizing precision can be expressed with 4 bits, is allocated to the quantizing precision data 83, and 198 bytes is allocated to the blank area 88. Thus 212 bytes can be allocated to one frame. Actually, different values will be set for the first format-conforming normalizing coefficient data but since the quantizing precision data are set all to zero, so it will be interpreted that all the spectrum data are zero for the first coding method. Eventually, when the code string data shown in FIG. 12 is played back by the first format-conforming player, no sound is played back and thus no terrible noise will take place. With the number of encoding units being a minimum one allowable by the first format, a wide recording area can be assured for the second codec and the top position of the second codec can be fixed.

Figure 12:
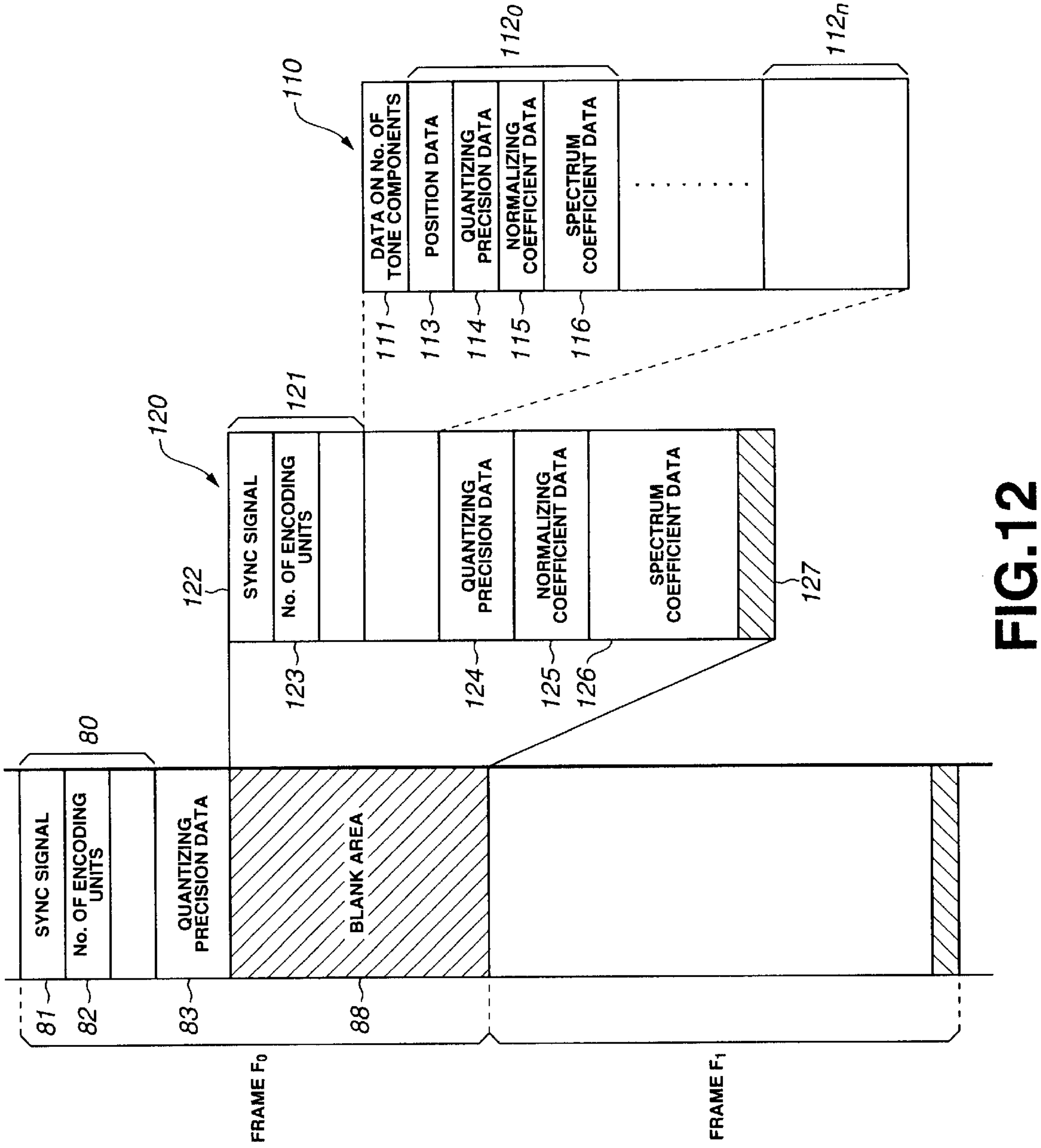
FIG. 12 explains a second method adopted in the encoder shown in FIG. 1.
Figure 13:
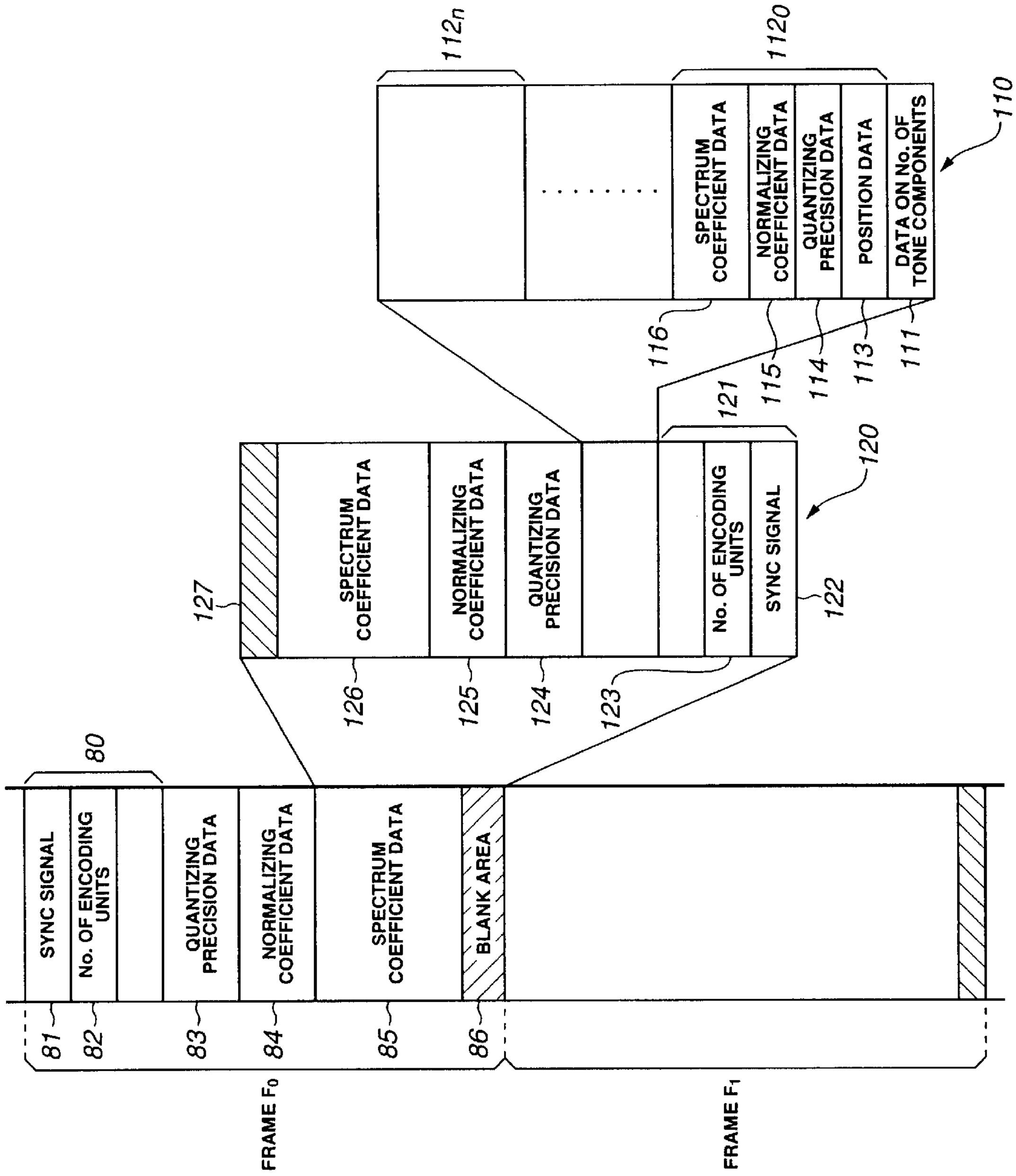
FIG. 13 shows another coding method.

Referring now to FIG. 13, there is illustrated a specific example of the code string recording method, different from those shown in FIGS. 11 and 12, according to the present invention. In this example, the second codec-based code string in each encoding frame is recorded in an opposite order to that for the first code, and each codec can be read independently. Since in both the first and second codecs, silent data can be made compact, a sufficiently high quality of a sound signal can be assured even if a sound signal code string of the first codec and silent data code string of the second codec, and the sound signal code string of the second codec and silent data code string of the first codec, are recorded dually. In this embodiment, in a second format-conforming player, it suffices to always decode the signal from the end of each encoding frame. Note that with the quantizing precision data 83 being all set to zero, portions of the normalizing coefficient data 84 and spectrum coefficient data 85, respectively, may be added to the recording area of the second codec.

Figure 14:
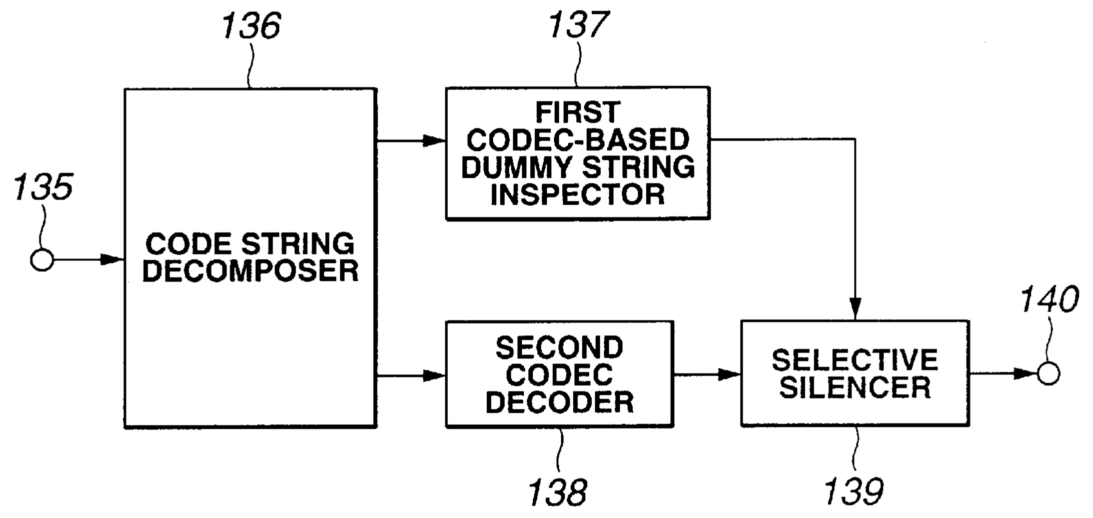
FIG. 14 is a block diagram of a decoder to read an acoustic signal from a recording medium having recorded therein the code string shown in FIG. 12.

Next, the embodiment of the decoder according to the present invention will be described. Referring now to FIG. 14, there is illustrated in the form of a block diagram a decoder to read an acoustic signal from a recording medium having recorded therein the code string shown in FIG. 12. In the decoder, a code string decomposer 136 sends to a first codec-based dummy string inspector 137 a portion of a code string shown in FIG. 12, supplied via an input terminal 135, corresponding to the first format header 80 and first codec-based quantizing precision data 83, while sending to a second codec decode block 138 other second codec-based code string portion of the code string. The first codec-based dummy string inspector 137 will check whether the received code string contains a first format header and zero bit at allocated quantizing precision data. If it is determined that the code string received by the first codec-based dummy string inspector 137 contains the first format header and zero bit-allocated quantizing precision data, a selective silencer 139 will provide an acoustic signal provided from the second codec decode block 138. When it is determined that the received code string is not as specified, the code string is taken as an invalid one and a silent playback is done. Note that if the recording to the recording medium is as shown in FIG. 11, the code string decomposer 136 will send to the first codec-based dummy string inspector 137 a portion of the code string shown in FIG. 11, corresponding to the first format header, first codec-based quantizing precision data and normalizing coefficient data while sending portions in other areas to the second codec decode block 138.

Figure 15:
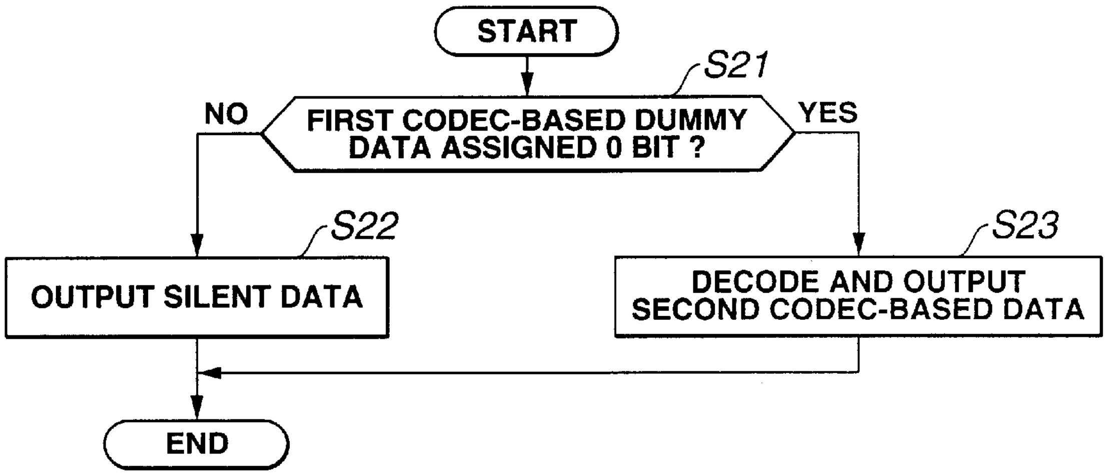
FIG. 15 is a flow chart of operations effected in a selective silencer forming the decoder in FIG. 14.

Referring now to FIG. 15, there is shown a flow chart of operations effected when the selective silencer 139 plays back an acoustic signal based on the result of the inspection by the first codec-based dummy string inspector 137 as in the above. At step S21, it is judged whether the first codec-based dummy data is zero bit-allocated. If the result of the judgment is NO, the operation goes to step S22 where silent data is provided as an output. On the contrary, if the judgment result is YES, the operation goes to step S23 where a decoded data generated by decoding the second codec-based data is provided as an output.

Figure 16:
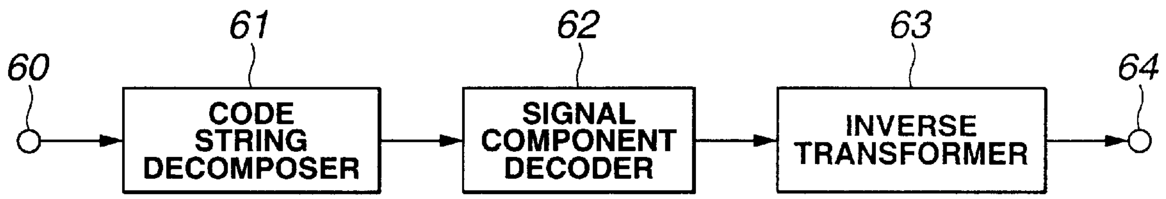
FIG. 16 is a block diagram of a conventional decoder corresponding to the encoder shown in FIG. 2.

The conventional decoder corresponding to the encoder shown in FIG. 2 is provided to generate an acoustic signal from the code string generated by the encoder in FIG. 2. As shown in FIG. 16, it supplies a code string provided at an input terminal 60 to a code string decomposer 61 which in turn will extract a code of each signal component. Then, after each signal component is restored from the code by a signal component decode block 62, an inverse transform block 63 provides an acoustic waveform signal as an output.

Figure 17:
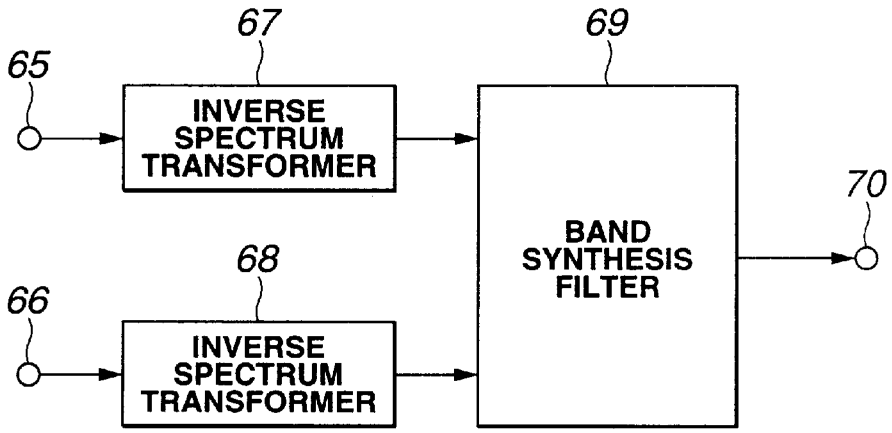
FIG. 17 is a block diagram of an inverse transform block forming the conventional decoder shown in FIG. 16.

Referring now to FIG. 17, there is illustrated in the form of a block diagram the inverse transform block 63 forming the conventional decoder shown in FIG. 16. The transform block 63 corresponds to the specific example of the transform block shown in FIG. 3. A signal component supplied from input terminals 65 and 66 is transformed by inverse spectrum transform blocks 67 and 68 to signals of various frequency bands. These signals are combined by a band synthesis filter 69 and then delivered at an output terminal 70.

Figure 18:
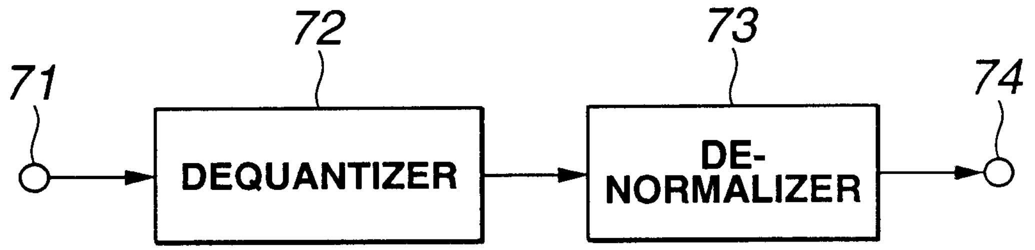
FIG. 18 is a block diagram of a signal component decode block forming the decoder in FIG. 16.

Referring now to FIG. 18, there is illustrated in the form of a block diagram the signal component decode block 62 forming the decoder in FIG. 16. An output signal from the code string decomposer 61 is supplied to a dequantizer 72 via an input terminal 71 where it will in turn be dequantized, and then it is de-normalized by a de-normalizer 73 to a spectrum signal which is delivered at an output terminal 74.

Figure 19:
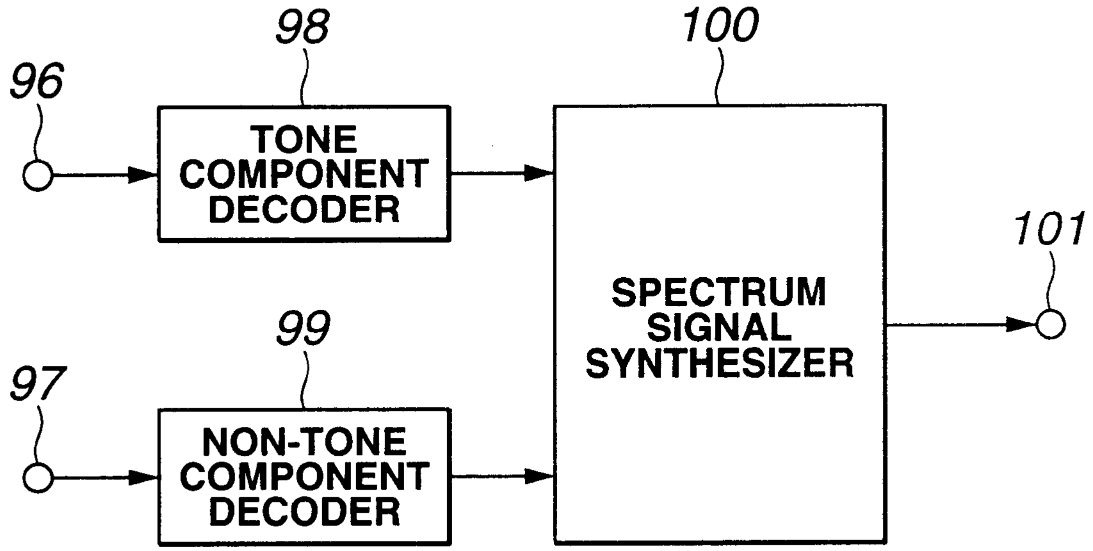
FIG. 19 is a block diagram of the essential parts of the decoder, to decode a signal whose tone component has been separated and encoded by the encoder shown in FIG. 12.

FIG. 19 is a block diagram of the essential parts of the decoder to decode a signal whose tone component has been separated and encoded by the encoder shown in FIG. 8. The decoder itself is constructed similarly to that shown in FIG. 16. The signal component decode block 62 in FIG. 16 is constructed as in FIG. 19. Namely, a tone component in a code string decomposed by the code string decomposer 61 is supplied from an input terminal 96 to a tone component decode block 98 while a non-tone component is supplied from an input terminal 97 to a non-tone component decode block 99. The tone component decode block 98 and non-tone component decode block 99 decode the tone and non-tone components, respectively, and supply their outputs to a spectrum signal synthesizer 100. A synthetic spectrum signal generated by the spectrum signal synthesizer 100 is delivered at an output terminal 101.

Figure 20:
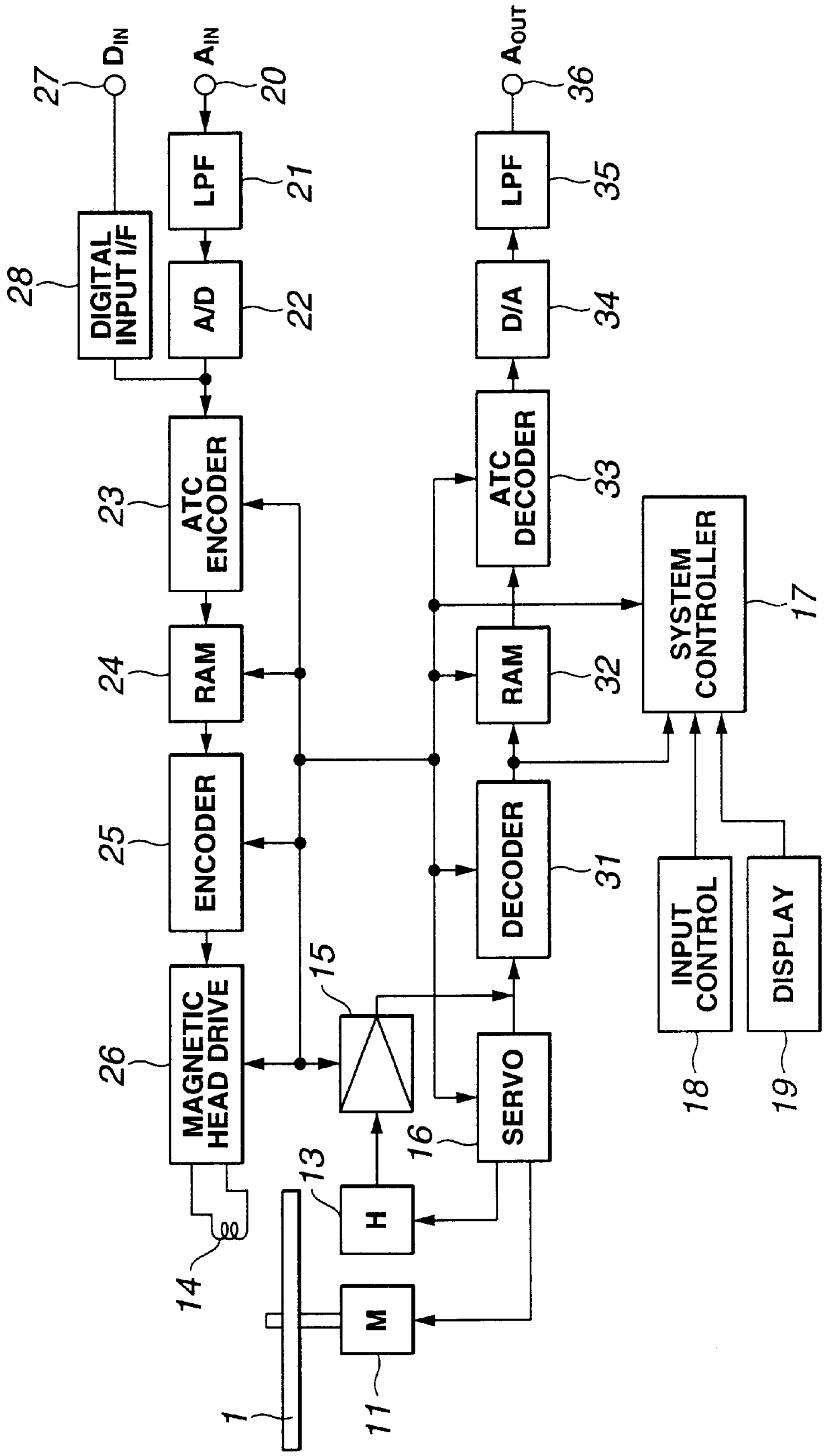
FIG. 20 is a block diagram of a recorder and/or player to which the conventional encoder and decoder or the encoder and decoder according to the present invention can be applied.

The encoder shown in FIG. 2 and decoder shown in FIG. 16 are employed in a recorder and/or player shown in FIG. 20 for example. The recorder and/or player is intended to write a first code string encoded by the first encode block and conforming to the first format to a recording medium and also read only that first code string. Thus, since the recorder and/or player will read a second code string conforming to the second format and supplied from the second encode block from a recording medium as a code string encoded by the first encode block, a terrible noise will take place. To avoid this, a code string shown in FIG. 11, 12 or 13, encoded by the encoder according to the present invention, will be effectively written to or read from such a recorder and/or player.

First, the construction of the recorder and/or player will be described below:

A recording medium used in this recorder and/or player is a magneto-optical disc 1 driven to rotate by a spindle motor 11. For write of data to the magneto-optical disc 1, a modulated field corresponding to the to-be-written data is applied to the disc 1 by a magnetic head 14 while a laser light is being irradiated to the disc 1 from an optical head 13. That is, a magnetic field modulated recording is effected to write the data to the magneto-optical disc 1 along the recording track thereon. Also, to read data from the magneto-optical disc 1, the recording track on the disc 1 is traced with a laser light by the optical head 13 to magneto-optically read the data from the disc 1.

The optical head 13 includes for example, a laser source such as a laser diode or the like, optical parts such as a collimator lens, objective lens, polarizing beam splitter, cylindrical lens, etc., a photodetector having a predetermined pattern of photosensors, etc. The optical head 13 is provided opposite to the magnetic head 14 with the magneto-optical disc 1 placed between them. For writing data to the magneto-optical disc 1, a head drive circuit 26 in a recording system which will further be described later, drives the magnetic head 14 to apply a modulated magnetic field corresponding to the to-be-written data while driving the optical head 14 to irradiate a laser light to a destination track on the magento-optical disc 1, thereby effecting a thermoelectric recording by the magnetic field modulating method. Also, the optical head 13 detects a return light of the laser light irradiated to the destination track to detect a focus error by the so-called astigmatic method for example, and also a tracking error by the so-called pushpull method, for example. To read data from the magneto-optical disc 1, the optical head 13 detects the focus error and tracking error while detecting a difference in the polarized angle (Kerr rotation angle) of the return light of the laser light from the destination track to generate a reading signal.

The output of the optical head 13 is supplied to an RF circuit 15. The RF circuit 15 extracts the focus error signal and tracking error signal from the output of the optical head 13 and supplies them to a servo control circuit 16 while binarizing the reading signal and supplying it to a decoder 31 in a playback system which will further be described later.

The servo control circuit 16 consists of, for example, a focus servo control circuit, tracking servo control circuit, spindle motor servo control circuit, sled servo control circuit, etc. The focus servo control circuit controls the focus of the optical system of the optical head 13 so that the focus error signal will be zero. The tracking servo control circuit controls the tracking of the optical system of the optical head 13 for the tracking error signal to become zero. Further, the spindle motor servo control circuit controls the spindle motor 11 to rotate the magneto-optical disc 1 at a predetermined speed (at a constant linear velocity, for example). Further, the sled servo control circuit moves the optical head 13 and magnetic head 14 to a destination track position on the magneto-optical disc 1, designated by a system controller 17. The servo control circuit 16 providing such control operations sends information indicative of the operating status of each of the components controlled thereby to the system controller 17.

The system controller 17 has a key input control unit 18 and display unit 19 connected thereto. The system controller 17 is supplied with operation input information from the key input control unit 18 to control the recording and playback systems according to the information. Also the system controller 17 manages the write position and read position on the recording track, traced by the optical head 13 and magnetic head 14, respectively, based on address information in sectors, read as a header time and sub-code Q data from the recording track on the magneto-optical disc 1. Moreover the system controller 17 controls the display unit 19 to display a read time based on the data compression rate of the recorder and/or player and information on the read position on the recording track.

For the read time, an actual time information is determined by multiplying the address information in sectors (absolute time information) read as the so-called header time and so-called sub-code Q data read from the recording track on the magneto-optical disc 1 by the reciprocal of the data compression rate (for example, "4" when the compression rate is 1/4), and it is displayed on the display unit 19. Note that also during data write, in case an absolute time information is previously recorded in the recording track on the magneto-optical disc (preformatted) for example, the preformatted absolute time information is read and multiplied by the data compression rate, whereby the present position can be displayed as an actual write time.

Next, in the recording system of the disc recorder/player, an analog audio input signal AIN from an input terminal 20 is supplied to an A/D converter 22 via a lowpass filter 21, and it is quantized by the A/D converter 22. A digital audio signal from the A/D converter 22 is supplied to an ATC (adaptive transform coding) encoder 23 being a specific example of the encoder shown in FIG. 2. A digital audio input signal DIN from an input terminal 27 is also supplied to the ATC encoder 23 via a digital input interface circuit 28. The ATC encoder 23 subjects a digital audio PCM data to be transferred at a predetermined rate, generated by quantizing the input signal AIN by the A/D converter 22, to a bit compression (data compression) based on a predetermined data compression rate. The compressed data (ATC data) from the ATC encoder 23 is supplied to a memory 24. Concerning a data compression rate being 1/8 for example, the data transfer rate is reduced to 1/8 (9.375 sectors/sec) of the data transfer rate (75 sectors/sec) of data in the standard CD-DA format.

The memory 24 is used as a buffer memory to and from which data write and read are controlled by the system controller 17 to provisionally store the ATC data supplied from the ATC encoder 23 and write data to the disc as necessary. More specifically, when the data compression rate is 1/8 for example, compressed audio data supplied from the ATC encoder 23 is transferred at a rate reduced to 1/8 (9.375 sectors/sec) of the transfer rate (75 sectors/sec) of data in the standard CD-DA format. The compressed audio data is continuously written into the memory 24. The compressed data (ATC data) can be written in every 8 sectors. However, since such data write in every 8 sectors is almost impossible in practice, data write is made in successive sectors as will be described later.

The data write is made at a burst at the same transfer rate (75 sectors/sec) as that of data in the standard CD-DA format taking as a recording unit a cluster of a predetermined plurality of sectors (32 sectors + a few sectors, for example) with a pause between sectors. More specifically, ATC audio data written successively at a rate as slow as 9.375 (=75/8) sectors/sec corresponding to the bit compression rate and compressed at a rate of 1/8 is read, as data to be written to the disc, from the memory 24 at a burst at the transfer rate of 75 sectors/sec. The read data to be written to the disc is transferred at a rate as slow as 9.375 sectors/sec including the write pause, while the rate of momentary data transfer within a time of the writing operation effected at a burst is the standard 75 sectors/sec. Therefore, when the disc rotating speed is the same as the transfer rate of data in the standard CD-DA format (constant linear velocity), data will be written at the same recording density and in the same storage pattern as those of data in the CD-DA format.

The ATC data, or data to be written to the magneto-optical disc, having continuously been read out from the memory 24 at a burst at the transfer rate (momentary rate) of 75 sectors/sec, is supplied to an encoder 25. In data supplied from the memory 24 to the encoder 25, the unit continuously written per write operation includes a cluster containing a plurality of sectors (e.g., 32 sectors) and a few sectors disposed before and after the cluster to connect clusters to each other. The cluster connecting sectors are set longer than the interleave length in the encoder 25 and not to influence the data in the other clusters when interleaved between the clusters.

The encoder 25 subjects the to-be-written data supplied at a burst from the memory 24 as in the above to an encoding process for error correction (parity addition and interleaving), EFM encoding process, etc. The to-be-written data encoded by the encoder 25 is supplied to a magnetic head drive circuit 26. The magnetic head drive circuit 26 has the magnetic head 14 connected thereto, and drives the magnetic head 14 to apply a modulated magnetic field corresponding to the to-be-written data to the magneto-optical disc 1.

The system controller 17 provides the above-mentioned control of the memory 24 and also controls the write position in such a manner that the to-be-written data read at a burst from the memory 24 under the above control is continuously written to the recording track on the magneto-optical disc 1. The write position control is effected by the system controller 17 managing the write position for the to-be-written data read at a burst from the memory 24 and supplying the servo control circuit 16 with a control signal designating the write position on the recording track on the magneto-optical disc 1.

Next, the playback system will be described. The playback system is destined to read data continuously written on the recording track on the magneto-optical disc 1 by the aforementioned recording system. It includes a decoder 31 which is supplied with a read output acquired by tracing the recording track on the magneto-optical disc 1 with a laser light from the optical head 13 and then binarized by the RF circuit 15. At this time, it is possible to read not only the magneto-optical disc but a read-only optical disc similar to a compact disc.

The decoder 31 is provided correspondingly to the encoder 25 included in the aforementioned recording system. It subjects the read output binarized by the RF circuit 15 to the above-mentioned decoding process for error correction and EFM decoding process to play back the ATC audio data having been compressed at a rate of 1/8 at the transfer rate of 75 sectors/sec faster than the normal transfer rate. The read data provided from the decoder 31 is supplied to a memory 32.

The memory 32 is controlled by the system controller 17 concerning the data write and read. The read data supplied at the transfer rate of 75 sectors/sec from the decoder 31 is written into the memory 32 at a burst at the transfer rate of 75 sectors/sec. Also, from the memory 32, the read data written once into the memory 32 at the transfer rate of 75 sectors/sec is continuously read out at the transfer rate of 9.375 sectors/sec corresponding to the data compression rate of 1/8.

The system controller 17 writes the read data into the memory 32 at the transfer rate of 75 sectors/sec, and controls the memory 32 for continuous read of the read data from the memory 32 at the transfer rate of 9.375 sectors/sec. Also, the system controller 17 provides the above-mentioned control of the memory 32 and also controls the read position in such a manner that the read data written at a burst into the memory 32 under the above control is continuously read from the recording track on the magneto-optical disc 1. The read position control is effected by the system controller 17 managing the read position for the read data written at a burst into the memory 32 and supplying the servo control circuit 16 with a control signal designating the read position on the recording track on the magneto-optical disc or optical disc 1.

The ATC audio data provided as the data continuously read from the memory 32 at the transfer rate of 9.375 sectors/sec is supplied to an ATC decoder 33 that is the decoder shown in FIG. 5. The ATC decoder 33 is provided correspondingly to the ATC encoder 23 in the recording system. It plays back 16-bit digital audio data by expanding (bit expansion) 8 times for example. Digital audio data from the ATC decoder 33 is supplied to a D/A converter 34.

The D/A converter 34 converts the digital audio data supplied from the ATC decoder 33 to an analog signal to generate an analog audio signal AOUT. The analog audio signal AOUT provided from the D/A converter 34 is delivered at an output terminal 36 via a lowpass filter 35.

By having the recorder and/or player constructed and operative as having been described in the foregoing play a magneto-optical disc having recorded therein the code strings shown in FIGS. 11, 12 and 13, noise can be prevented from taking place. This is because the ATC decoder 33 in the playback system of the recorder and/or player recognizes as a silent data the second one, generated by the second coding method, of the code strings shown in FIGS. 11. 12 and 13.

Also, the ATC decoder 33 included in the playback system of the recorder and/or player has the function of the decoder shown in FIG. 14. For example, when it is determined by reading the TOC area for example that the magneto-optical disc having recorded therein the code strings shown in FIGS. 11, 12 and 13 is loaded in the recorder and/or player, it is possible to provide an acoustic signal by the above-mentioned operations. When the code string is judged to be invalid as the second code string, silent playback can be done.

Further, the ATC encoder 23 provided in the recording system of the recorder and/or player has the function of the encoder shown in FIG. 1, the recorder and/or player can generate the code strings shown in FIGS. 11, 12 and 13 by encoding at the time of reading, and also read them.

Figure 21:
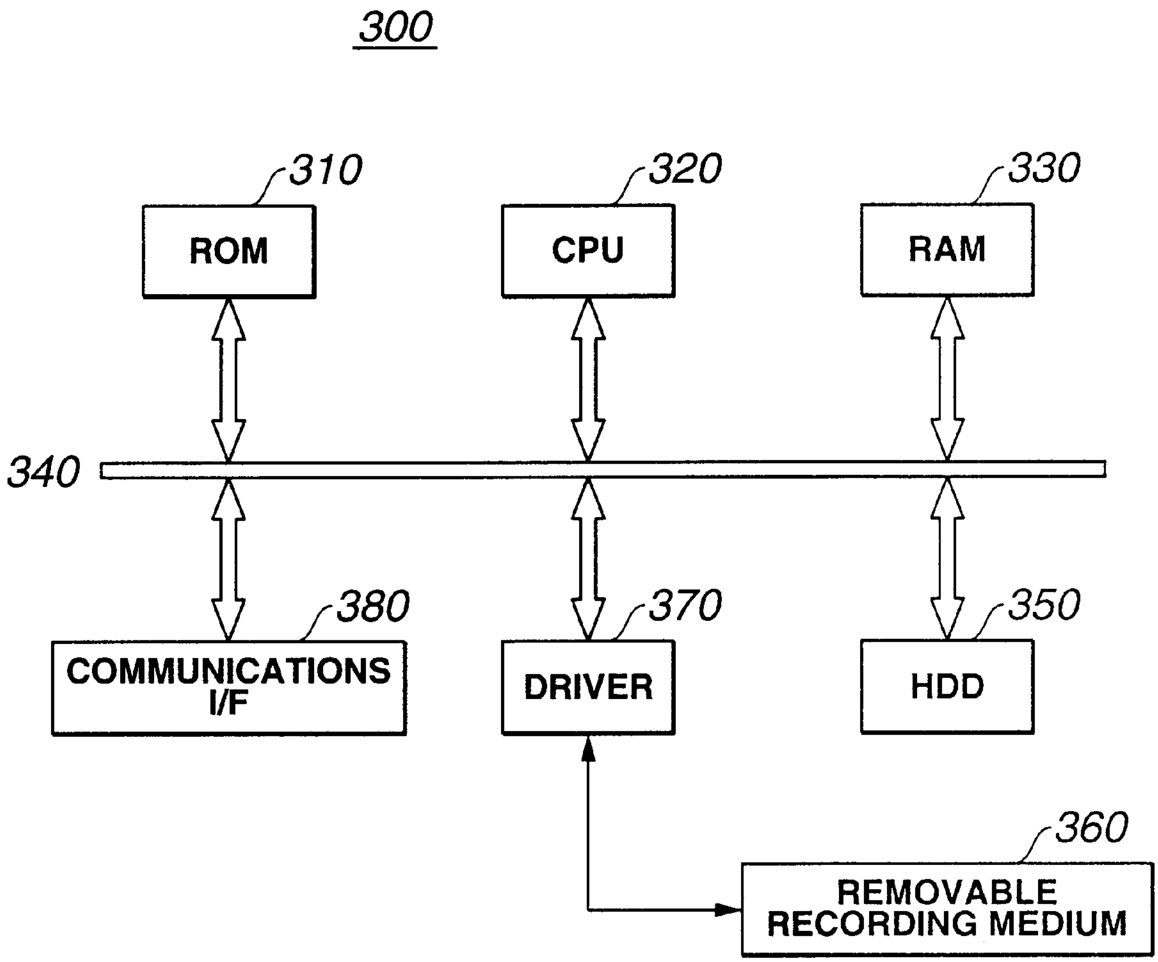
FIG. 21 is a block diagram of an information processor in which the encoder according to the present invention is embodied.
Figure 22:
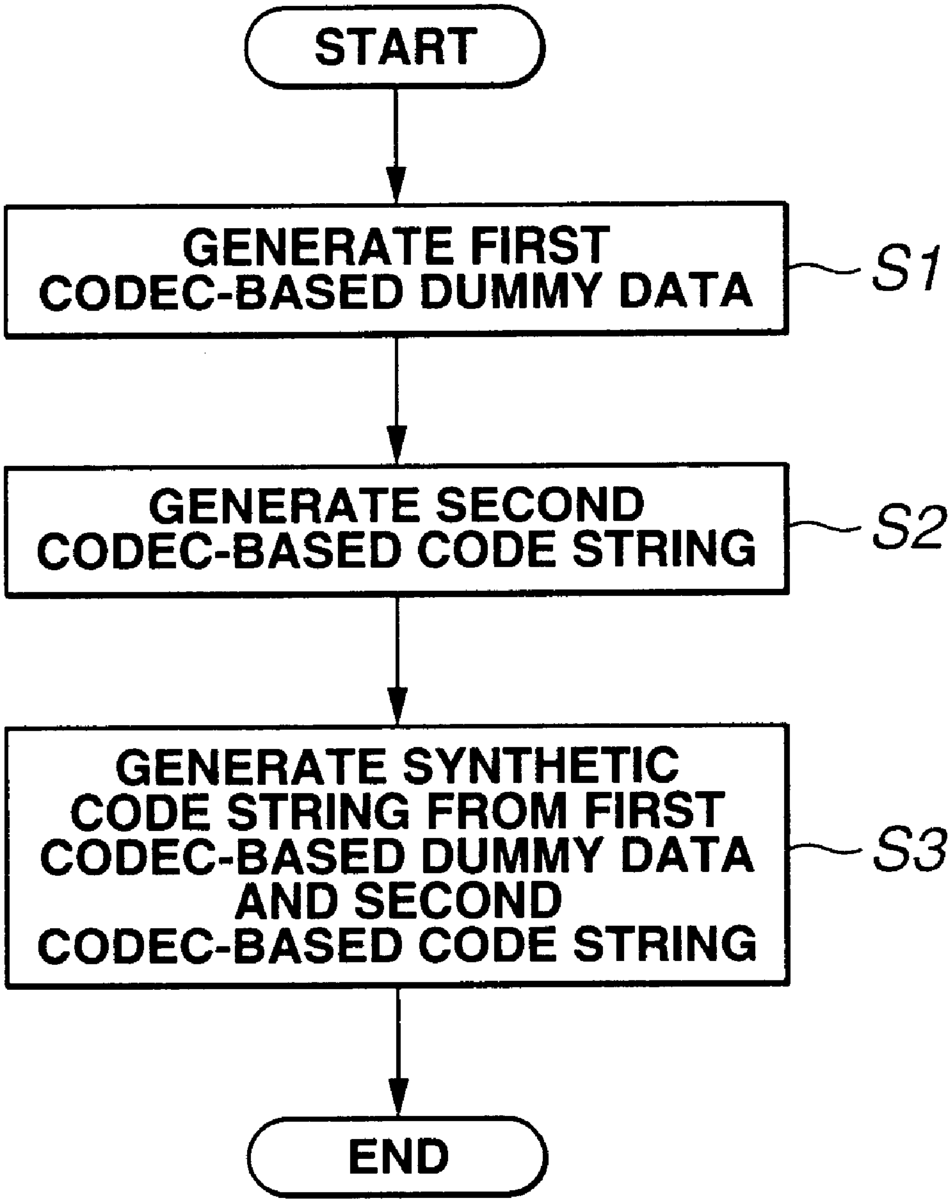
FIG. 22 is a flow chart of operations effected in execution of a coding program by the information processor in FIG. 21.

Referring now to FIGS. 21 and 22, another embodiment of the encoding method according to the present invention will be illustrated and described. FIG. 21 is a block diagram of an information processor in which the encoder according to the present invention is embodied, and FIG. 22 is a flow chart of operations effected in execution of a coding program by the information processor in FIG. 21. The information processor executes a program based on the encoding method. It records in an internal recording medium thereof or downloads via a removable recording medium such as a floppy disc an encoding program to which the encoding method is applied, and executes the encoding program by a CPU included therein. Namely, the information processor functions as the aforementioned encoder.

The information processor is generally indicated with a reference 300. It will be described in detail with reference to FIG. 21. It has a CPU (central processing unit) 320 having connected thereto via a bus 340 a ROM 310, RAM 330, communications interface (I/F) 380, driver 370 and an HDD 350. The driver 370 drives a removable recording medium 360 such as a PC card, CD-ROM or floppy disc (FD).

The ROM 310 has stored therein an IPL (initial program loading) program and the like. According to the IPL program stored in the ROM 310, the CPU 320 executes an OS (operating system) program stored in the HDD 350, and further executes a data exchange program stored in the HDD 350 for example under the control of the OS program. The RAM 330 stores provisionally programs and data necessary for the operations of the CPU 320. The communications interface 380 is provided for communications with external devices.

The encoding program is taken out from the HDD 350 for example by the CPU 320 and executed in the RAM 330 as a work area by the CPU 320 which will effect the operations shown in the flow chart in FIG. 22

At step S1, first codec-based dummy data is generated. After that, second codec-based code string is generated at step S2. Then at step S3, both the first codec-based dummy data and second codec-based code string are combined together to generate a synthetic code string.

Since the information processor executes the encoding program, it functions like the encoder with no dedicated hardware. That is, a relatively wide recording area can be assured for the second coding method and no noise is allowed to occur even when data encoded by the second coding method is played in a first format-conforming player.

What is claimed is:

1. An encoder comprising:

means for generating a dummy string;

a first encoding means for generating a first code string by forming a blank area in a frame based on the dummy string;

a second encoding means for generating a second code string by encoding an input signal; and a code string synthesizing means for generating a synthetic code string by embedding the second code string generated by the second encoding means in the blank area in the first code string.

2. The encoder as set forth in claim 1, wherein the first encoding means generates a first code string conforming to a first format and a second encoding means generates the second code string conforming to a second format different from the first format.

3. The encoder as set forth in claim 1, wherein the dummy string generating means generates a dummy string of data indicating a silent signal in the first code string.

4. The encoder as set forth in claim 3, wherein the first code string has quantizing precision data for each decoding unit being a collection of a plurality of spectrum signals and the dummy string generating means generates a dummy string having quantizing precision data indicating zero bit.

5. The encoder as set forth in claim 3, wherein the dummy string generating means generates a dummy string which minimizes an encoded data area in the first code string.

6. The encoder as set forth in claim 5, wherein the first code string has data indicating a number of encoding units in a header of an encoding frame and the dummy string generating means minimizes the number of encoding units to minimize the encoded data area in the first code string.

7. The encoder as set forth in claim 1, wherein the code string synthesizing means records the second code string generated by the second encoding means in the blank area in a direction from an end of the encoding frame towards a top of the encoding frame.

8. An encoding method comprising:

generating a dummy string;

generating a first code string by forming a blank area in a frame based on the dummy string;

generating a second code string by encoding an input signal; and generating a synthetic code string by embedding the second code string generated by the second encoding means in the blank area in the first code string.

9. An encoder comprising:

a first encoding means for generating a first code string;

a second encoding means for generating a second code string; and a code string synthesizing means for generating a synthetic code string in such a manner that a part of the second code string generated by the second encoding means forms a part of the first code string.

10. The encoder as set forth in claim 9, wherein the first code string consists of encoded data obtained by making a predetermined number of encoding units each being a collection of a plurality of spectrum data and determining quantizing precision data and normalizing coefficient data for each encoding unit and the code string synthesizing means embeds a part of the second code string in a recording area of the normalizing coefficient data in the first code string.

11. The encoder as set forth in claim 10, wherein the first encoding means allocates zero to the quantizing precision data.

12. The encoder as set forth in claim 10, wherein the first encoding means minimizes a data area in an encoded frame in the first code string.

13. The encoder as set forth in claim 12, wherein the first encoding means minimizes the number of the encoding units written in a header in the encoded frame in the first code string to minimize the data area.

14. The encoder as set forth in claim 9, wherein the code string synthesizing means records the second code string generated by the second encoding means in a partial area formed by the encoding means and blank area in the first encoding means in a direction from an end of the encoding frame towards a top of the encoding frame.

15. An encoding method comprising:

generating a first code string;

generating a second code string; and generating a synthetic code string in such a manner that a part of the second code string generated by the second encoding means forms a part of the first code string.

16. A recording medium comprising:

an encoder including:

a mechanism which generates a dummy string in a first code string;

a mechanism which forms a blank area in the first code string based on the dummy string; and a mechanism which generates a synthetic code string by embedding a second code string recorded in the blank area formed in the first code string.

17. A recording medium comprising:

an encoder including:

a mechanism for generating a first code string and a second code string; and a mechanism for synthesizing a synthetic code string so that a part of the second code string forms a part of the first code string.

18. A decoder comprising:

means for receiving a code string obtained by embedding a second code string in a blank area formed in a first code string based on a dummy string generated in the first code string;

means for detecting the dummy string from a synthetic code string received by a synthetic code string receiving means;

means for decoding the second code string; and means for controlling output of a signal generated by decoding the second code string according to whether the dummy string detecting means has detected a predetermined dummy string.

19. The decoder as set forth in claim 18, wherein the output controlling means provides a predetermined sound when the dummy string detecting means detects no predetermined dummy string.

20. The decoder as set forth in claim 19, wherein the predetermined sound provided when the predetermined dummy string is not detected is silent.

21. The decoder as set forth in claim 18, wherein the synthetic code string receiving means receives the synthetic code string obtained by embedding the second code string in the blank area formed in the first code string based on the dummy string generated in the first code string in a direction from a trailing end towards a leading end of an encoded frame.

22. A decoding method comprising steps of:

receiving a synthetic code string obtained by embedding a second code string in a blank area formed in a first code string based on a dummy string generated in the first code string;

detecting the dummy string from a synthetic code string received at a synthetic code string receiving step;

decoding the second code string; and controlling output of a signal generated by decoding the second code string depending upon whether the dummy string detecting means has detected a predetermined dummy string.

23. A decoder comprising:

means for receiving a code string synthesized so that a part of a second code string forms a part of a first code string;

means for detecting a predetermined dummy string from a synthetic code string received by a synthetic code string receiving means;

means for decoding the second code string; and means for controlling output of a signal generated by decoding the second code string depending upon whether the dummy string detecting means has detected the predetermined string.

24. The decoder as set forth in claim 23, wherein the output controlling means provides a predetermined sound when the dummy string detecting means detects no predetermined dummy string.

25. The decoder as set forth in claim 24, wherein the predetermined sound provided when the predetermined dummy string is not detected is silent.

26. The decoder as set forth in claim 23, wherein the synthetic code string receiving means receives a synthetic code string obtained by embedding the second code string in a blank area formed in the first code string based on the dummy string generated in the first code string and a partial area of the first code string in a direction from a trailing end towards a leading end of an encoded frame.

27. A decoding method comprising steps of:

receiving a code string synthesized so that a part of a second code string forms a part of a first code string;

detecting a predetermined dummy string from a synthetic code string received at a synthetic code string receiving step;

decoding the second code string; and controlling output of a signal generated by decoding the second code string depending upon whether the dummy string detecting means has detected the predetermined string.

* * * * *